United States Patent
Zhang et al.

(10) Patent No.: US 11,600,689 B2
(45) Date of Patent: Mar. 7, 2023

(54) DISPLAY SUBSTRATE HAVING A VARYING WIDTH POWER SUPPLY WIRE, DISPLAY PANEL AND DISPLAY DEVICE HAVING THE SAME

(71) Applicants: Chengdu BOE Optoelectronics Technology Co., Ltd., Chengdu (CN); BOE TECHNOLOGY GROUP CO., LTD., Beijing (CN)

(72) Inventors: Meng Zhang, Beijing (CN); Linhong Han, Beijing (CN); Zhenhua Zhang, Beijing (CN); Tingliang Liu, Beijing (CN); Yongjie Song, Beijing (CN); Huijuan Yang, Beijing (CN); Xiaofeng Jiang, Beijing (CN); Yi Qu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 3 days.

(21) Appl. No.: 17/281,487

(22) PCT Filed: May 22, 2020

(86) PCT No.: PCT/CN2020/091833
§ 371 (c)(1),
(2) Date: Mar. 30, 2021

(87) PCT Pub. No.: WO2021/232411
PCT Pub. Date: Nov. 25, 2021

(65) Prior Publication Data
US 2022/0190100 A1 Jun. 16, 2022

(51) Int. Cl.
*H01L 27/32* (2006.01)
*G09G 3/3225* (2016.01)
(Continued)

(52) U.S. Cl.
CPC ....... *H01L 27/3279* (2013.01); *G09G 3/3225* (2013.01); *G09G 3/3266* (2013.01);
(Continued)

(58) Field of Classification Search
None
See application file for complete search history.

(56) References Cited

U.S. PATENT DOCUMENTS

| 7,106,279 | B2 * | 9/2006 | Hirayama | ................ G09G 3/20 345/80 |
| 9,281,320 | B2 | 3/2016 | Ham et al. | |

(Continued)

FOREIGN PATENT DOCUMENTS

| CN | 1779753 A | 5/2006 |
| CN | 101625493 A | 1/2010 |

(Continued)

OTHER PUBLICATIONS

International Search Report of PCT/CN2020/091833 in Chinese, dated Feb. 22, 2021.
(Continued)

*Primary Examiner* — Sepehr Azari
(74) *Attorney, Agent, or Firm* — Collard & Roe, P.C.

(57) ABSTRACT

A display substrate, a display panel and a display device. A pixel circuit includes a power supply wire providing a power supply voltage to the display pixel; a drive circuit in the non-display region includes a drive signal wire providing a drive signal to the pixel circuit; the power supply wire includes a narrow wire portion overlapping with the drive signal wire and a wide wire portion; a wire width of the narrow wire portion is less than that of the wide wire portion; the display substrate has a first side for display and a second side opposite to the first side, includes a bending region at an edge of the base substrate; the power supply
(Continued)

wire and the drive signal wire extend from the first side to the bending region, crossing the bending region to extend to the second side; the narrow wire portion is on the second side.

20 Claims, 11 Drawing Sheets

(51) Int. Cl.
*G09G 3/3266* (2016.01)
*G11C 19/28* (2006.01)
*H01L 51/00* (2006.01)

(52) U.S. Cl.
CPC ............... *G09G 2300/0426* (2013.01); *G09G 2300/0819* (2013.01); *G09G 2310/0286* (2013.01); *G09G 2330/021* (2013.01); *G11C 19/287* (2013.01); *H01L 51/0097* (2013.01); *H01L 2251/5338* (2013.01)

(56) References Cited

U.S. PATENT DOCUMENTS

| | | | | |
|---|---|---|---|---|
| 9,893,093 | B2* | 2/2018 | Kim | H01L 27/124 |
| 10,170,534 | B1* | 1/2019 | Kim | H01L 27/3223 |
| 10,937,855 | B2* | 3/2021 | Jo | H01L 27/3279 |
| 2003/0227433 | A1* | 12/2003 | Moon | G09G 3/3677 |
| | | | | 345/100 |
| 2004/0108977 | A1* | 6/2004 | Hirayama | H01L 27/3279 |
| | | | | 345/76 |
| 2009/0135113 | A1 | 5/2009 | Taneda et al. | |
| 2013/0075934 | A1 | 3/2013 | Oto et al. | |
| 2015/0179727 | A1* | 6/2015 | Kim | G09G 3/3225 |
| | | | | 361/748 |
| 2015/0187279 | A1* | 7/2015 | Lee | H01L 51/56 |
| | | | | 438/23 |
| 2016/0225787 | A1* | 8/2016 | Katsuta | H01L 27/1222 |
| 2017/0288008 | A1 | 10/2017 | Kim et al. | |
| 2018/0315387 | A1* | 11/2018 | Park | G09G 3/3674 |
| 2018/0366066 | A1* | 12/2018 | Kim | H01L 27/3265 |
| 2019/0179449 | A1* | 6/2019 | Cho | G06F 3/04164 |
| 2019/0377445 | A1* | 12/2019 | Jeong | G06F 3/047 |
| 2020/0209177 | A1* | 7/2020 | Kim | G02F 1/1339 |
| 2020/0211470 | A1* | 7/2020 | Lim | H01L 51/5253 |
| 2020/0235193 | A1* | 7/2020 | Tokuda | H01L 51/50 |

FOREIGN PATENT DOCUMENTS

| | | |
|---|---|---|
| CN | 202736910 U | 2/2013 |
| CN | 110310572 A | 10/2019 |
| CN | 109166528 B | 5/2020 |
| JP | H10171369 A | 6/1998 |

OTHER PUBLICATIONS

Notice of Transmittal of the International Search Report of PCT/CN2020/091833 in Chinese, dated Feb. 22, 2021.
Written Opinion of the International Searching Authority of PCT/CN2020/091833 in Chinese, dated Feb. 22, 2021.
European Search Report in European Application No. 20900747.5 dated Sep. 20, 2022.

* cited by examiner

DISPLAY SUBSTRATE HAVING A VARYING WIDTH POWER SUPPLY WIRE, DISPLAY PANEL AND DISPLAY DEVICE HAVING THE SAME

CROSS REFERENCE TO RELATED APPLICATIONS

This application is the National Stage of PCT/CN2020/091833 filed on May 22, 2020, the disclosure of which is incorporated by reference.

TECHNICAL FIELD

Embodiments of the present disclosure relate to a display substrate, a display panel and a display device.

BACKGROUND

Compared with traditional liquid crystal displays (LCD), an active matrix organic light-emitting diode (AMOLED) display has advantages of self-illumination, wide color gamut, high contrast and lightness, so that the AMOLED is widely used in mobile phones, tablet computers, and other fields, and also widely used in flexible wearable fields, such as smart watches. Generally, a pixel circuit is provided in a display region, and a gate drive circuit, such as a GOA drive circuit, is provided in a frame region to provide a drive signal to the pixel circuit.

SUMMARY

At least one embodiment of the present disclosure provides a display substrate including a base substrate, a pixel circuit, and a drive circuit. The base substrate includes a display region and a non-display region, the display region includes a display pixel, and the non-display region surrounds at least a part of the display region; the pixel circuit includes a power supply wire, the power supply wire is configured to provide a power supply voltage to the display pixel; the drive circuit at least partially in the non-display region, and includes a drive signal wire, the drive signal wire is configured to provide a drive signal to the pixel circuit; the power supply wire includes a narrow wire portion and a wide wire portion connected to the narrow wire portion, an orthographic projection of the narrow wire portion on the base substrate at least partially overlaps with an orthographic projection of the drive signal wire on the base substrate, and a wire width of the narrow wire portion is less than a wire width of the wide wire portion; the display substrate has a first side for display and a second side opposite to the first side, and includes a bending region at an edge of the base substrate, and the power supply wire and the drive signal wire extend from the first side to the bending region and cross the bending region to further extend to the second side; and the narrow wire portion of the power supply wire is at least on the second side of the display substrate.

For example, in the display substrate provided by at least one embodiment of the present disclosure, an orthographic projection of a first part of drive signal wires among the plurality of drive signal wires on the base substrate at least partially overlaps with the orthographic projection of the narrow wire portion on the base substrate, and an orthographic projection of a second part of drive signal wires among the plurality of drive signal wires on the base substrate at least partially overlaps with the orthographic projection of the wide wire portion on the base substrate, and a total number of the second part of drive signal wires is less than a total number of the first part of drive signal wires; or, an orthographic projections of the plurality of drive signal wires on the base substrate do not overlap with the orthographic projection of the wide wire portion on the base substrate.

For example, in the display substrate provided by at least one embodiment of the present disclosure, the drive signal wire includes a bending portion on the second side of the display substrate, and the bending portion includes a transverse portion and a longitudinal portion that are connected with each other; and an extension direction of the longitudinal portion is substantially identical to an extension direction of the power supply wire, and the transverse portion overlaps with the power supply wire in a direction perpendicular to the base substrate.

For example, the display substrate provided by at least one embodiment of the present disclosure further includes a first power supply circuit and a second power supply circuit. The first power supply circuit is on the second side of the display substrate and configured to provide the power supply voltage to the power supply wire; and the second power supply circuit on the second side of the display substrate and configured to provide the drive signal to the drive circuit.

For example, in the display substrate provided by at least one embodiment of the present disclosure, the power supply wire is connected to the first power supply circuit and led out from the first power supply circuit, and the drive signal wire is connected to the second power supply circuit and led out from the second power supply circuit; a position, where the power supply wire is led out from the first power supply circuit, is on a side of a position, where the drive signal wire is led out from the second power supply circuit, close to the edge of the display substrate.

For example, in the display substrate provided by at least one embodiment of the present disclosure, the wide wire portion includes a first portion and a second portion; and the narrow wire portion has a first end and a second end in an extension direction of the power supply wire, the first portion is connected to the first end of the narrow wire portion, and the second portion is connected to the second end of the narrow wire portion.

For example, in the display substrate provided by at least one embodiment of the present disclosure, the wire width of the narrow wire portion is less than or equal to half of the wire width of the wide wire portion.

For example, in the display substrate provided by at least one embodiment of the present disclosure, a wire width of the power supply wire is greater than a wire width of the drive signal wire.

For example, in the display substrate provided by at least one embodiment of the present disclosure, the wire width of the narrow wire portion of the power supply wire is greater than the wire width of the drive signal wire.

For example, in the display substrate provided by at least one embodiment of the present disclosure, the display substrate has a first side for display and a second side opposite to the first side, and includes a bending region at an edge of the base substrate, and the power supply wire and the drive signal wire extend from the first side to the bending region and cross the bending region to further extend to the second side; and the narrow wire portion of the power supply wire is at least on the second side of the display substrate.

For example, in the display substrate provided by at least one embodiment of the present disclosure, the display substrate has a first side for display and a second side opposite to the first side, and the narrow wire portion of the power supply wire is in a non-display region on the first side of the display substrate.

For example, in the display substrate provided by at least one embodiment of the present disclosure, the power supply wire includes a first power supply wire and a second power supply wire. The first power supply wire is configured to provide a first power supply voltage to the display pixel, and the second power supply wire is configured to provide a second power supply voltage to the display pixel, wherein a polarity of the second power supply voltage is opposite to a polarity of the first power supply voltage; and at least one selected from a group consisting of the first power supply wire and the second power supply wire includes the narrow wire portion and the wide wire portion.

For example, in the display substrate provided by at least one embodiment of the present disclosure, the drive circuit includes a gate drive circuit; and the gate drive circuit includes a plurality of cascaded shift registers. The plurality of cascaded shift registers include a first shift register, a second shift register, . . . , and an Nth shift register, wherein N is a positive integer, and each of the shift registers includes a signal input terminal and a signal output terminal; and a trigger signal wire connected to the signal input terminal of first shift register and configured to provide a trigger signal to the first shift register; the drive signal wire includes the trigger signal wire.

For example, in the display substrate provided by at least one embodiment of the present disclosure, the drive signal includes a scan drive signal; and the trigger signal wire includes a scan trigger signal wire configured to provide a scan trigger signal to the first shift register so that the first shift register outputs the scan drive signal; the scan drive signal is provided to the pixel circuit.

For example, in the display substrate provided by at least one embodiment of the present disclosure, the gate drive circuit further includes a gate scan wire which is connected to a signal output terminal of a shift register and configured to provide the scan drive signal output from the shift register to the pixel circuit; and the pixel circuit includes a data wire, a light emission device, and a first transistor, a second transistor and a storage capacitor, the first transistor, a second transistor and a storage capacitor are in the display pixel. The data wire is configured to provide a data signal to the display pixel; the light emission device includes a first electrode and a second electrode, the first power supply wire is connected to the first electrode of the light emission device to receive the first power supply voltage; a gate electrode of the first transistor is connected to the gate scan wire to receive the scan drive signal, a first electrode of the first transistor is connected to the data wire to receive the data signal, and a second electrode of the first transistor is connected to a gate electrode of the second transistor; a first electrode of the second transistor is connected to the second power supply wire to receive the second power supply voltage, and a second electrode of the second transistor is connected to the second electrode of the light emission device; and a first electrode of the storage capacitor is connected to the gate electrode of the second transistor, and a second electrode of the storage capacitor is connected to the second power supply wire.

For example, in the display substrate provided by at least one embodiment of the present disclosure, the drive signal further include a light emission control drive signal; and the trigger signal wire further includes a light emission control trigger signal wire configured to provide a light emission control trigger signal to the first shift register so that the shift register outputs the light emission control drive signal, wherein the light emission control drive signal is provided to the pixel circuit.

For example, in the display substrate provided by at least one embodiment of the present disclosure, the scan drive signal includes a first scan drive signal and a second scan drive signal, the light emission control drive signal includes a first light emission control drive signal and a second light emission control drive signal, and the drive signal further includes a reset drive signal; the gate drive circuit further includes a first scan wire, a second scan wire, a first light emission control wire and a second light emission control wire. The first scan wire and the second scan wire are connected to the signal output terminal of each of the shift registers and configured to respectively provide the first scan drive signal and the second scan drive signal that are output from the respective shift registers to the pixel circuit; and the first light emission control wire and the second light emission control wire are connected to the signal output terminal of each of the shift registers and are configured to respectively provide the first light emission control drive signal and the second light emission control drive signal that are output from the each of the shift registers to the pixel circuit; and the pixel circuit includes a data wire, a light emission device, an initial signal wire, and includes a first transistor, a second transistor, a third transistor, a fourth transistor, a fifth transistor, a sixth transistor, a seventh transistor and a storage capacitor in each display pixel. The data wire is configured to provide a data signal to the display pixel; the light emission device includes a first electrode and a second electrode, the first power supply wire is connected to the first electrode of the light emission device to receive the first power supply voltage; the initial signal wire is configured to provide an initial signal to the display pixel; a gate electrode of the first transistor is connected to a first node; a first electrode of the first transistor is connected to a second node, and a second electrode of the first transistor is connected to a third node; a gate electrode of the second transistor is connected to the first scan wire to receive the first scan drive signal, a first electrode of the second transistor is connected to the data wire to receive the data signal, and a second electrode of the second transistor is connected to the second node; a gate electrode of the third transistor is connected to the second scan wire to receive the second scan drive signal, a first electrode of the third transistor is connected to the first node, a second electrode of the third transistor is connected to the third node; a first electrode of the storage capacitor is connected to the first node, and a second electrode of the storage capacitor is connected to the second power supply wire to receive the second power supply voltage; a gate electrode of the fourth transistor is connected to the first light emission control wire to receive the first light emission control drive signal, a first electrode of the fourth transistor is connected to the second power supply wire to receive the second power supply voltage, and a second electrode of the fourth transistor is connected to the second node; a gate electrode of the fifth transistor is connected to the second light emission control wire to receive the second light emission control drive signal, a first electrode of the fifth transistor is connected to the third node, and a second electrode of the fifth transistor is connected to the second electrode of the light emission device; a gate electrode of the sixth transistor is connected to a reset control terminal to receive a reset drive signal, a first electrode of the sixth transistor is connected to the initial signal wire to receive the initial signal, and a second electrode of the sixth transistor is connected to the second electrode of the light emission device; and a gate electrode of the seventh transistor is connected to the reset control terminal to receive the reset drive signal, a first electrode of the seventh transistor is connected to the initial signal wire to receive the initial signal, and a second electrode of the seventh transistor is connected to the first node.

For example, in the display substrate provided by at least one embodiment of the present disclosure, the drive signal wire further includes an initial signal wire, and the initial signal wire extends from the non-display region to the display region.

For example, in the display substrate provided by at least one embodiment of the present disclosure, the drive signal wire further includes a clock signal wire, and the clock signal wire is configured to provide a clock control drive signal to each of the shift registers so that the scan drive signal and the light emission control drive signal are provided to the pixel circuit.

For example, in the display substrate provided by at least one embodiment of the present disclosure, the drive signal wire further includes a low-level signal wire and a high-level signal wire. The low-level signal wire is connected to each of the shift registers and configured to provide a first voltage drive signal to each of the shift registers; and the high-level signal wire is connected to each of the shift register and configured to provide a second voltage drive signal to each shift register, wherein the second voltage is greater than the first voltage.

For example, in the display substrate provided by at least one embodiment of the present disclosure, each selected from the group consisting of the first power supply wire and the second power supply wire respectively includes a first power supply sub-trace and a second power supply sub-trace, and the first power supply sub-trace and the second power supply sub-trace respectively include the narrow wire portion and the wide wire portion; the drive signal wire include a first signal sub-trace and a second signal sub-trace, and an extension direction of the first signal sub-trace is opposite to an extension direction of the second signal sub-trace extend, and the first signal sub-trace and the second signal sub-trace are respectively at two opposite sides of the display region; the narrow wire portion of the first power supply sub-trace at least partially overlaps with the first signal sub-trace in a direction perpendicular to the base substrate, and the narrow wire portion of the second power supply sub-trace at least partially overlaps with the second signal sub-trace in the direction perpendicular to the base substrate.

For example, in the display substrate provided by at least one embodiment of the present disclosure, the power supply wire enters the display region from a first side of the display region close to the first power supply circuit; or, the power supply wire enters the display region from a side, which intersects with the first side of the display region, of the display region.

At least one embodiment of the present disclosure provides a display panel, and the display panel includes the display substrate provided by any one of the embodiments of the present disclosure.

At least one embodiment of the present disclosure provides a display device, and the display device includes the display panel provided by any one of the embodiments of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
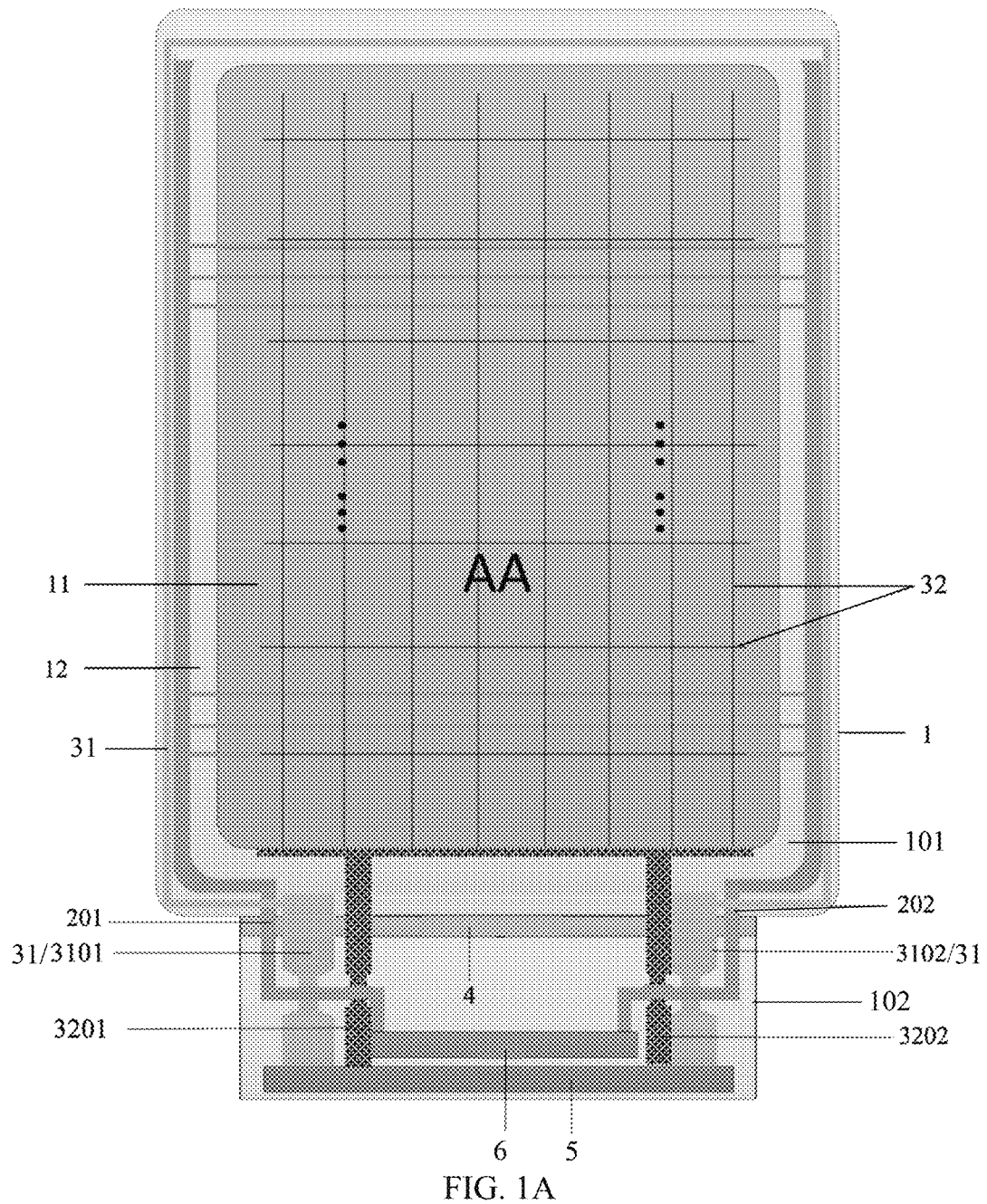
FIG. 1A is a structural schematic diagram of a display substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Inside" "outside" "on," "under," and the like are only used to indicate relative position relationship, and when the position of the object which is described is changed, the relative position relationship may be changed accordingly.

The drawings in the present disclosure are not drawn according to actual proportions or scales, and the amount (numbers) of shift registers in the display substrate and the amount (numbers) of power supply wires in the display region are not limited to those illustrated in the drawings, and the specific size and number of each structure can be determined according to actual needs. The drawings described in the present disclosure are only structural schematic diagrams.

At least one embodiment of the present disclosure provides a display substrate including a base substrate, a pixel circuit, and a drive circuit. The base substrate includes a display region and a non-display region, the display region includes a display pixel, and the non-display region surrounds at least a part of the display region; the pixel circuit includes a power supply wire, the power supply wire is configured to provide a power supply voltage to the display pixel; the drive circuit at least partially in the non-display region, and includes a drive signal wire, the drive signal wire is configured to provide a drive signal to the pixel circuit; the power supply wire includes a narrow wire portion and a wide wire portion connected to the narrow wire portion, an orthographic projection of the narrow wire portion on the base substrate at least partially overlaps with an orthographic projection of the drive signal wire on the base substrate, and a wire width of the narrow wire portion is less than a wire width of the wide wire portion; the display substrate has a first side for display and a second side opposite to the first side, and includes a bending region at an edge of the base substrate, and the power supply wire and the drive signal wire extend from the first side to the bending region and cross the bending region to further extend to the second side; and the narrow wire portion of the power supply wire is at least on the second side of the display substrate.

Figure 1B:
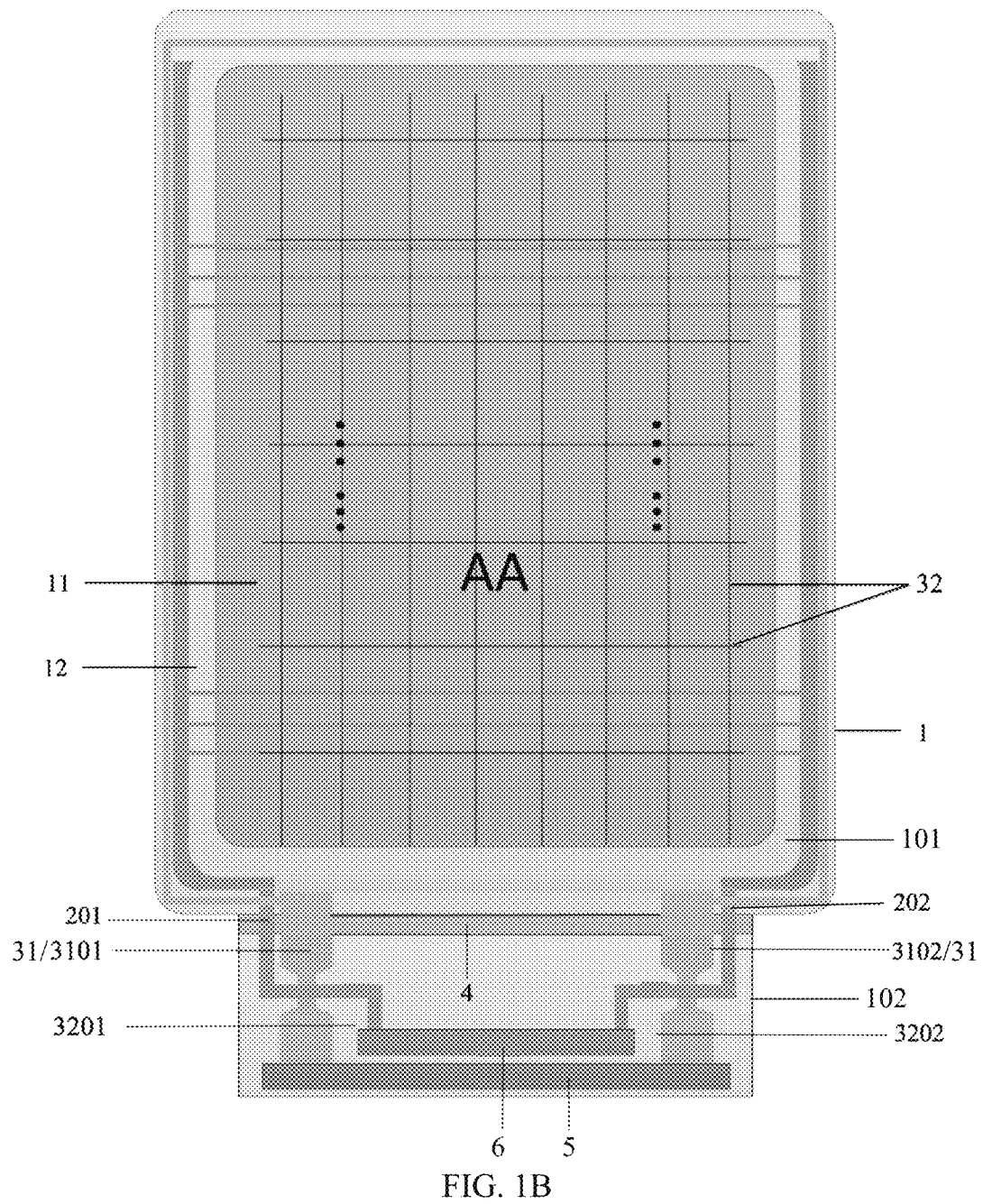
FIG. 1B is a structural schematic diagram of another display substrate provided by an embodiment of the present disclosure.
Figure 2A:
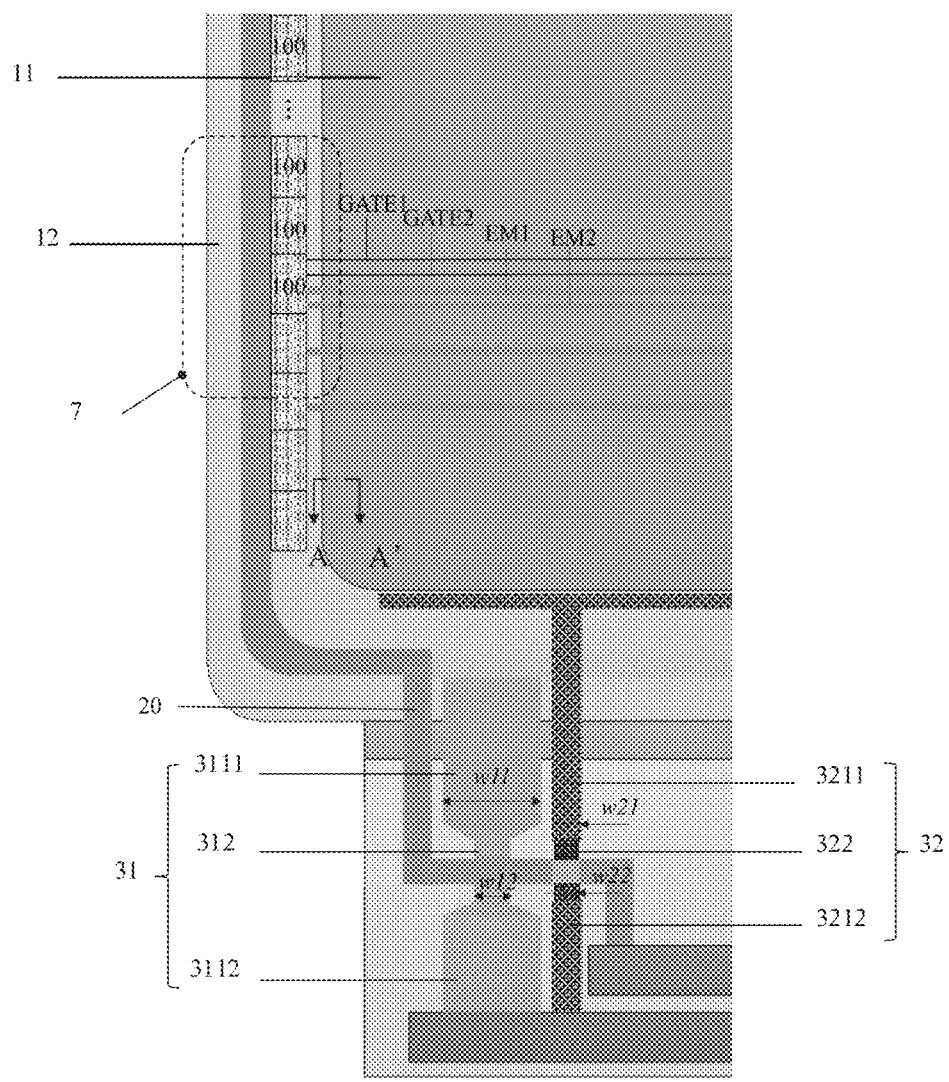
FIG. 2A is a partial schematic diagram including a first power supply wire, a second power supply wire and a drive circuit as illustrated in FIG. 1A.

Illustratively, FIG. 1A is a structural schematic diagram of a display substrate provided by an embodiment of the present disclosure. As illustrated in FIG. 1A, FIG. 2A is a partial schematic diagram including a first power supply wire, a second power supply wire and a drive circuit as illustrated in FIG. 1A, and the case that the second power supply wire also includes a narrow wire portion is taken as an example herein. The features, except the related features of the second power supply wire, in FIG. 2A described below, are all applicable to the embodiment as illustrated in FIG. 1B. Referring to FIGS. 1A and 2A, the display substrate 10 includes a base substrate 1, a pixel circuit, and a drive circuit. The base substrate 1 includes a display region 11 and a non-display region 12. The display region 11 includes a plurality of display pixels, for example, the plurality of display pixels are arranged in an array; the non-display region 12 surrounds the display region 11. Of course, in other embodiments, the non-display region 12 may surround a part of the display region 11. The pixel circuit includes a power supply wire, the power supply wire includes a first power supply wire 31 and a second power supply wire 32. The first power supply wire 31 is configured to provide a first power supply voltage to the display pixels, and the second power supply wire 32 is configured to provide a second power supply voltage to the display pixels, a polarity of second power supply voltage is opposite to a polarity of the first power supply voltage. For example, the polarity of the first power supply voltage is negative and the polarity of the second power supply voltage is positive. For example, in the embodiment as illustrated in FIGS. 1A and 2A, the first power supply wire 31 includes a narrow wire portion 312 and a wide wire portion 3111/3112 connected to the narrow wire portion 312. A part of the drive circuit is located in the non-display region 12, and the drive circuit includes a power supply wire 20, the drive signal wire 20 is configured to provide a drive signal to the pixel circuit. As illustrated in FIG. 2A, an orthographic projection of the narrow wire portion 312 of the first power supply wire 31 on the base substrate 1 at least partially overlaps with an orthographic projection of the drive signal wire 20. For example, a part or all of the orthographic projection of the narrow wire portion 312 of the first power supply wire 31 overlaps with the orthographic projection of the drive signal wire 20 on the base substrate 1, and a wire width w12 of the narrow wire portion 311 of the first power supply wire 31 is less than a wire width w11 of the wide wire portion 3111/3111 of the first power supply wire 31. In the embodiment of the present disclosure, a parasitic capacitance formed between the drive signal wire 20 and the first power supply wire 31 is reduced because the wire width of the narrow wire portion 311 of the first power supply wire 31 overlapping with the drive signal wire 20 in s direction perpendicular to the base substrate 1 is reduced, thereby improving the time efficiency of signal conduction on the drive signal wire 20, enabling the designed ideal drive signal to be transmitted to the pixel circuit and improving the display effect. As illustrated in FIG. 1A, the display substrate has a first side 101 for display (i.e., a display side) and a second side 102 opposite to the first side 101; the display substrate includes a bending region 4 located at an edge of the base substrate 1, and the first power supply wire 31, the second power supply wire 32 and the drive signal wire 20 extend from the first side to the bending region and cross the bending region 4 to further extend to the second side 102, that is, a portion below the bending region 4 as illustrated in FIG. 1A is bent to the second side of the display substrate. In this case, the narrow wire portion of the first power supply wire 31 and the narrow wire portion of the second power supply wire 32 are located on the second side of the display substrate.

For example, in some embodiments, the first side 101 and the second side 102 of the display substrate are substantially on a same plane, as illustrated in FIGS. 1A and 2A, a circuit board carrying the narrow wire portion 312 and part of the drive circuit is not folded to the back of the display side. In this case, the first side 101 is a side of the bending region 4 close to the display region 11, the second side 102 is a side of the bending region 4 away from the display region 11, and the first side 101 and the second side are located on both sides of the bending region 4 and are opposite to each other in a same plane. For example, in other embodiments, the circuit board carrying the narrow wire portion and part of the drive circuit is folded to the back of the display side by bending the bending region 4, and the first side 101 and the second side 102 of the display substrate are located on different surfaces respectively, that is, the first side 101 is the display side, and the second side 102 is the back side of the first side 101, and is a non-display side.

It should be noted that the "wire width" in the present disclosure refers to a width of the wire in a direction perpendicular to the extension direction of the wire.

Or, the orthographic projection of the wide wire portion 3111/3112 of the first power supply wire 31 on the base substrate 1 does not overlap with the orthographic projection of the drive signal wire 20 on the base substrate 1.

For example, as illustrated in FIG. 2A, the wide wire portion of the first power supply wire 31 includes a first portion 3111 and a second portion 3112; the narrow wire portion 312 of the first power supply wire 31 has a first end and a second end in the extension direction of the first power supply wire. The first portion 3111 is connected to the first end of the narrow wire portion 312, and the second portion 3112 is connected to the second end of the narrow wire portion 312. Therefore, the wire width of the portion of the first power supply wire 31 that does not overlap with the drive signal wire 20 is wider as much as possible, so that the influence on the resistance of the first power supply wire 31 because of the reduction of the local wire width is reduced as much as possible, and thus conduction of the signal in the first power supply wire 31 is not affected as much as possible.

For example, the wire width of the narrow wire portion 312 of the first power supply wire 31 is less than or equal to half of the wire width of the wide wire portion of the first power supply wire 31, so as to achieve an ideal effect of reducing parasitic capacitance, for example, the wire width of the first portion 3111 is equal to the wire width of the second portion 3112.

For example, the wire width of the first power supply wire 31 is much greater than wire width of each drive signal wire 20, and the wire width of the narrow wire portion 312 of the first power supply wire 31 is greater than the wire width of each drive signal wire 20. That is, for example, the drive circuit includes a plurality of drive signal wires 20, the drive signal wires 20 include a plurality of different types of signal wires (the drive signal wires 20 as illustrated in FIG. 2A is a macroscopic view of a plurality of signal wires which are spaced apart from each other, and the enlarged schematic diagram is described later), and the wire width of the first power supply wire 31 is much greater than a wire width of each of the plurality of different types of signal wires, the wire width of the narrow wire portion 312 of the first power supply wire 31 is greater than the wire width of each of the plurality of different types of signal wires. In order to achieve the above-mentioned purpose of improving the display effect, it is necessary not only to reduce the parasitic capacitance on the drive signal wires 20 but also not to increase the resistance of the drive signal wires 20 as much as possible. Under the condition that the wire width of the first power supply wire 31 is much greater than the wire width of each of the drive signal wires 21, on the one hand, there is little space for reducing the wire width of each of the drive signal wires 21; on the other hand, if the wire width of each of the drive signal wires 20 are reduced, the effect of reducing parasitic capacitance is weak, but the resistance of the drive signal wires 20 is obviously increased, resulting in a poor display effect. Therefore, in a region where the drive signal wires 20 overlap with the first power supply wire 31, the wire width of the first power supply wire 31 is reduced without reducing the wire width of each of the drive signal wires 20.

For example, the wire width of the first power supply wire 31 is greater than the wire width of the second power supply wire 32, so that compared with the second power supply wire 32, in the region where the drive signal wires 20 overlap with the first power supply wire 31, the reduction extent of the wire width of the first power supply wire 31 can be greater, thereby achieving a greater effect of reducing parasitic capacitance.

For example, in some embodiments, as illustrated in FIG. 1A, the second power supply wire 32 also intersects with the drive signal wires 20, that is, the second power supply wire 32 has a portion overlapping with the drive signal wires 20 in the direction perpendicular to the base substrate 1, and the second power supply wire 32 includes a narrow wire portion 322 and a wide wire portion 3211/3212 connected to the narrow wire portion 322. An orthographic projection of the narrow wire portion 322 of the second power supply wire 32 on the base substrate 1 at least partially overlaps with the orthographic projections of the drive signal wires 20 on the base substrate 1, for example, a part or all of the orthographic projection of the narrow wire portion 322 of the second power supply wire 32 overlap with the orthographic projections of the drive signal wires 20 on the base substrate 1, an orthographic projection of the wide wire portion 3211/3212 of the second power supply wire 32 on the base substrate 1 does not overlap with the orthographic projections of the drive signal wires 20 on the base substrate 1, and a wire width w22 of the narrow wire portion 322 of the second power supply wire 32 is less than a wire width w21 of the wide wire portion 3211/3212 of the second power supply wire 32. In the embodiment of the present disclosure, because the wire width of the narrow wire portion 321 of the second power supply wire 32 overlapping with the drive signal wire 20 in the direction perpendicular to the base substrate 1 is reduced, a parasitic capacitance formed between the drive signal wires 20 and the second power supply wire 32 is further reduced on the basis of reducing the wire width of the narrow wire portion of the first power supply wire 31, thereby further improving the time efficiency of the signal conduction on the drive signal wires 20, enabling the designed ideal drive signal to be transmitted to the pixel circuit and further improving the display effect.

Of course, in other embodiments, the second power supply wire 32 may include the narrow wire portion 322 and the wide wire portion 3211/3212 connected to the narrow wire portion 322, while the wire width of the portion of the first power supply wire 31 overlapping with the drive signal wires 20 does not narrow, that is, "at least one selected from a group consisting of the first power supply wire and the second power supply wire includes the narrow wire portion and the wide wire portion".

For example, the first power supply wire 31 is a VSS wire connected to the pixel circuit, and the second power supply wire 32 is a VDD wire connected to the pixel circuit.

FIG. 1B is a structural schematic diagram of another display substrate provided by an embodiment of the present disclosure, the difference between the embodiment of FIG. 1B and the embodiment of FIG. 1A is that in the embodiment of FIG. 1B, only the first power supply wire 31 includes the narrow wire portion and the wide wire portion, and it is not limited that the second power supply wire also includes the narrow wire portion. Other features are the same as those in the embodiment illustrated in FIG. 1A and are repeated.

Figure 2B:
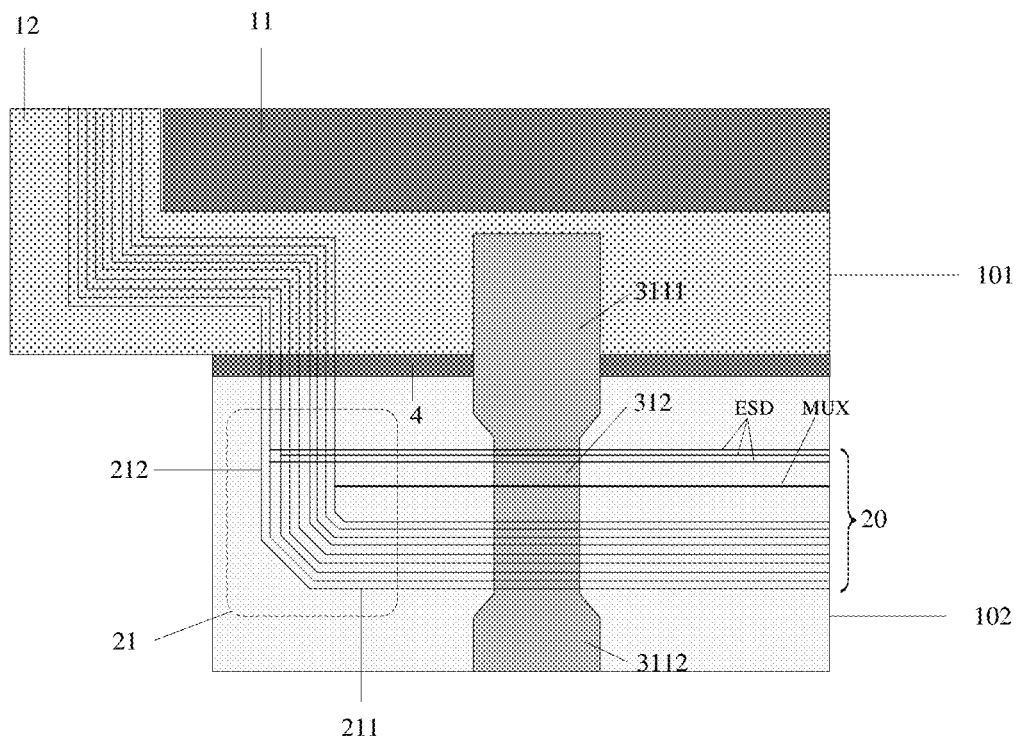
FIG. 2B is a partially enlarged schematic diagram of FIG. 2A.
Figure 2C:
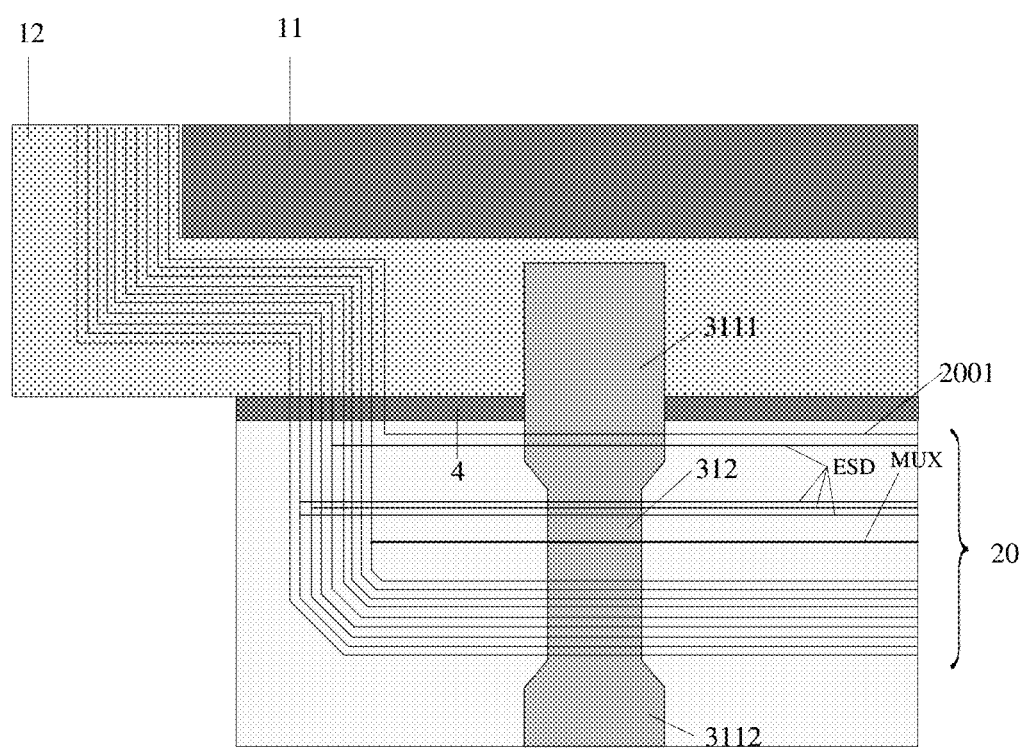
FIG. 2C is a partial schematic diagram of another display substrate provided by an embodiment of the present disclosure.
Figure 2D:
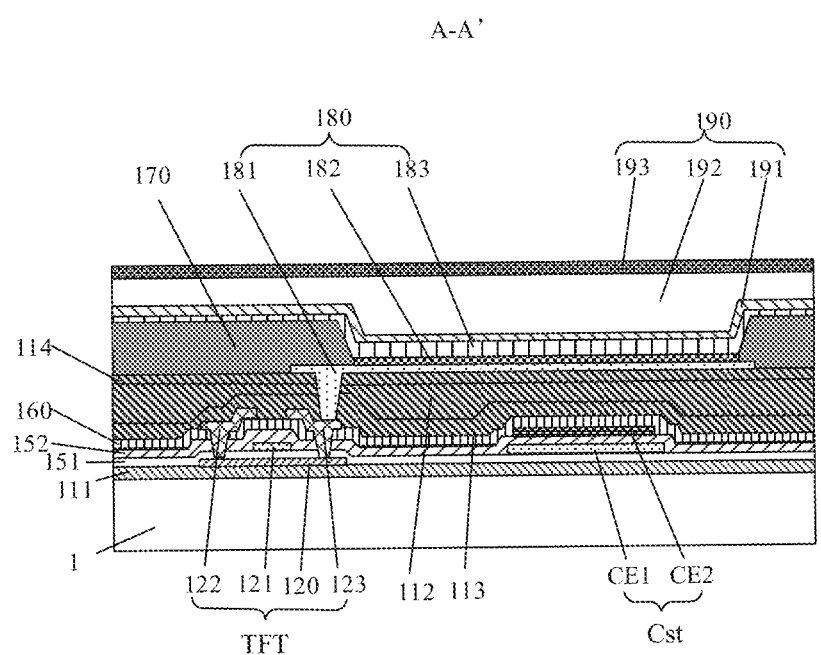
FIG. 2D is a schematic cross-sectional view of a display region of the display substrate as illustrated in FIG. 2A taken along the line A-A'.

FIG. 2D is a schematic cross-sectional view of the display region of the display substrate as illustrated in FIG. 2A taken along the wire A-A'. As illustrated in FIG. 2D, the pixel circuit of each sub-pixel of the display region 11 of the display substrate includes a thin film transistor (TFT), a light emission device 180, and a storage capacitor Cst. The thin film transistor includes an active layer 120, a gate electrode 121, a source electrode and drain electrode 122/123, the storage capacitor Cst includes a first plate CE1 and a second capacitor plate CE2. The light emission device 180 includes a cathode 183, an anode 181 and a light emission layer 182 which is between the cathode 183 and the anode 181, the anode 181 is electrically connected to one selected from a group consisting of the source electrode and drain electrode 122/123 of the thin film transistor TFT, for example, the drain electrode 123. Of course, in other embodiments, the anode 181 and the drain electrode 123 of the thin film transistor TFT may be electrically connected through a switch electrode. For example, the light emission device is an organic light emission diode (OLED) or a quantum dot light emission diode (QLED), and accordingly, the light emission layer 182 is an organic light emission layer or a quantum dot light emission layer.

For example, the first power supply wire 31 is arranged in the same layer as the gate electrode 121 of the thin film transistor TFT and the first plate CE1 of the storage capacitor Cst. The structure arranged in the same layer may be formed by one same patterning process, thereby simplifying the manufacturing process of the display substrate 20; or, the first power supply wire 31 is disposed in the same layer as the second capacitor plate CE2 of the storage capacitor Cst; or, each first power supply wire 31 includes a first portion which is arranged in the same layer as the gate electrode 121 of the thin film transistor TFT and the first plate CE1 of the storage capacitor Cst, and a second portion which is arranged in the same layer as the second plate CE2 of the storage capacitor Cst, and the first portion and the second portion that are respectively arranged in different layers are electrically connected through at least one via hole, so that the first portion and the second portion are connected in parallel to reduce the resistance of each first power supply wire 31, and in this case, for example, no via hole is provided at a position corresponding to the narrow wire portion of the first power supply wire 31.

For example, as illustrated in FIG. 2D, the display region 11 further includes a first gate insulation layer 151 which is located between the active layer 120 and the gate electrode 121, and a second gate insulation layer 152 and an interlayer insulation layer 160 which are located above the gate electrode 121, the second gate insulation layer 152 is located between the first plate CE1 and the second capacitor plate CE2, so that the first plate CE1, the second gate insulation layer 152 and the second capacitor plate CE2 constitute the storage capacitor Cst. The interlayer insulation layer 160 covers the second capacitor plate CE2.

Figure 3A:
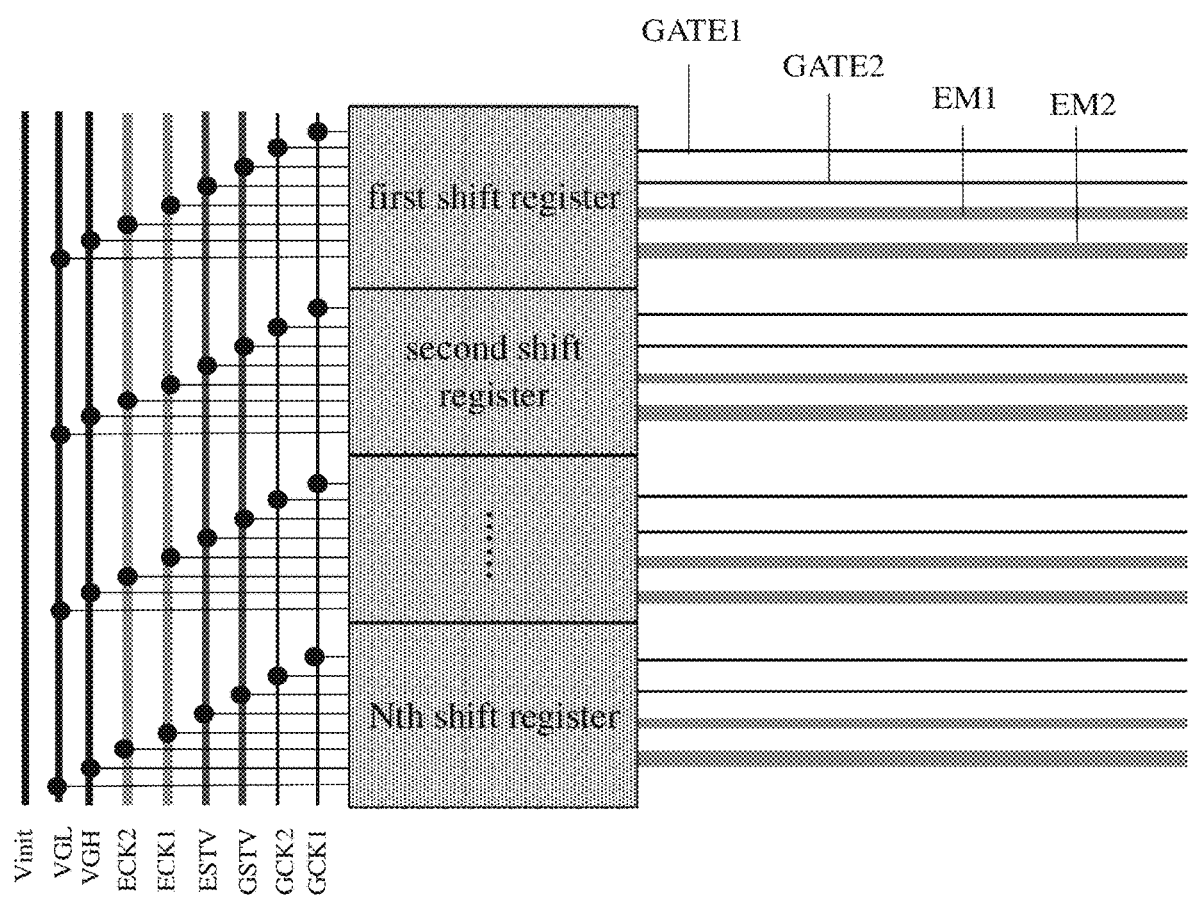
FIG. 3A is a partially enlarged schematic diagram of drive signal wires as illustrated in FIG. 1A.

For example, as illustrated in FIG. 2D, the display region 11 further includes an insulation layer 113 (e.g., a passivation layer) covering the pixel circuit and a first planarization layer 112. The display region 201 further includes a pixel definition layer 170 for defining a plurality of sub-pixels and spacers (not shown) on the pixel definition layer 170. As illustrated in FIG. 3A, in some embodiments, the insulation layer 113 is located above the source electrode and drain electrode 122/123 (for example, the passivation layer formed of silicon oxide, silicon nitride or silicon oxynitride, etc.), a first planarization layer 112 is disposed above the insulation layer 113, and the anode 181 is electrically connected to the drain electrode 123 through a via-hole penetrating through the first planarization layer 112 and the insulation layer 113.

For example, as illustrated in FIG. 2D, the display substrate further includes an encapsulation layer 190, the encapsulation layer 190 includes a plurality of encapsulation sub-layers 191/192/193. For example, a first encapsulation layer 291 is arranged in a same layer as a first encapsulation sub-layer 191 in the encapsulation layer 190, a second encapsulation layer 292 is arranged in a same layer as a second encapsulation sub-layer 192 in the encapsulation layer 190, and a third encapsulation layer 293 is arranged in a same layer as a third encapsulation sub-layer 193 of the encapsulation layer 190. For example, both the first encapsulation layer 291 and the third encapsulation layer 293 include an inorganic encapsulation material, such as silicon oxide, silicon nitride or silicon oxynitride, etc., and the second encapsulation layer 292 may include an organic material, such as resin materials, etc. The encapsulation structure with the plurality of encapsulation sub-layers of the display substrate can achieve a better encapsulation effect to prevent impurities, such as water vapor or oxygen, from penetrating into the display substrate.

In some embodiments, as illustrated in FIG. 2D, the display substrate further includes a buffer layer 111 on the base substrate 210, the buffer layer 111 serves as a transition layer, and can prevent harmful substances in the base substrate 1 from intruding into the display substrate, for example, intruding into the display region 11, and can also increase the adhesion of the layers in the display substrate to the base substrate 1. For example, a material of the buffer layer 111 includes a single-layer structure or a multi-layer structure that are made of insulation a material, such as silicon oxide, silicon nitride, silicon oxynitride, etc.

FIG. 2B is a partially enlarged schematic diagram of FIG. 2A. As illustrated in FIG. 2B, the drive signal wires in FIG. 2A includes a plurality of signal wires 20 spaced apart from each other. The plurality of drive signal wires 20 extend from the binding region on the second side of the display substrate and cross the bending region 4 to further extend into the non-display region 12 on the first side which is used for display of the display substrate, thereby forming various signal wires in FIG. 3A as described below.

For example, as illustrated in FIG. 2B, the plurality of drive signal wires 20 further include electrostatic shielding signal wires ESD, the electrostatic shielding signal wires ESD are electrically connected to at least a part of drive signal wires 20 the plurality of drive signal wires 20 and are grounded, so as to be configured to conduct static electricity between the plurality of drive signal wires to prevent adverse effects of static electricity on signal transmission. For example, the plurality of drive signal wires 20 further include multiplexer (MUX) signal wires, so that a total number of traces can be saved. Specifically, a MUX of 1:2 can be adopted, so that the amount of data signal wires can be saved by half before being input into the effective display region. For example, a MUX of 1:6 may be used, and the embodiments of the present disclosure are not limited to this case.

As illustrated in FIG. 2B, for example, at least a part of drive signal wires 20 among the plurality of drive signal wires 20 includes a bending portion 21 located on the second side 102, and the bending portion 21 includes a transverse portion 211 and a longitudinal portion 212 that are connected to each other. An extension direction of the longitudinal portion 212 is substantially the same as the extension directions of the power supply wire, for example, the first power supply wire 31, and an orthogonal projection of the transverse portion 211 on the base substrate 1 at least partially overlaps with the orthogonal projections of the power supply wire, on the base substrate 1. The longitudinal portion 212 extends across the bending region 4 into the first side 101. Therefore, a reasonable wire arrangement is realized so that the drive signal wires 20 extend from the second side 102 to the first side 101.

As illustrated in FIG. 1A, for example, the display substrate further includes a first power supply circuit 5 and a second power supply circuit 6. The first power supply circuit 5 is located on the second side of the display substrate and is configured to provide the power supply voltages to the power supply wire, i.e., a first power supply voltage is provided to the first power supply wire 31 and a second power supply voltage is provided to the second power supply wire 32. The second power supply circuit 6 is located on the second side of the display substrate and is configured to provide the above-mentioned drive signal to the drive circuit.

For example, as illustrated in FIG. 1A, the power supply wires (the first power supply wire 31 and the second power supply wire 32) are connected to the first power supply circuit 5 and are led out from the first power supply circuit 5, and the drive signal wires 20 are connected to the second power supply circuit 6 and are led out from the second power supply circuit 6. A position where the power supply wires (the first power supply wire 31 and the second power supply wire 32) are led out from the first power supply circuit 5 is located on a side, close to the edge of the display substrate, of a position where the drive signal wires 20 are led out from the second power supply circuit 6.

For example, as illustrated in FIG. 1A, a portion of the first power supply wire 31 on the first side 101 surrounds a part of the display region 11, for example, in an upper region of the display region 11, and the first power supply wire 31 is closed. For example, in FIG. 1A, the parts of the first power supply wire 31=in the non-display region 12 which is on left side and right side of the display region 11, are respectively located on a side of a drive signal wire 201 close to the edge of the display substrate and a side of a drive signal wire 202 close to the edge of the display substrate, so that the drive signal wires are closer to the display region 11, thereby reducing a length of wires connecting the drive signal wires into the display region, improving the transmission efficiency of the drive signal and facilitating the realization of a better display effect.

FIG. 2C is a partial schematic diagram of another display substrate provided to an embodiment of the present disclosure. The embodiment illustrated in FIG. 2C has the following differences from the embodiment illustrated in FIG. 2B. As illustrated in FIG. 2C, an orthographic projection of a first part of drive signal wires among the plurality of drive signal wires 20 on the base substrate 1 at least partially overlaps with the orthographic projection of the narrow wire portion 321 on the base substrate 1, an orthographic projection of a second part of drive signal wires 2001 on the base substrate 1 at least partially overlaps with the orthographic projection of the wide wire portion 3111 on the base substrate 1 (in other embodiments, the orthographic projection of the second part of drive signal wires 2001 on the base substrate 1 may at least partially overlap with the orthographic projection of the wide wire portion 3112 on the base substrate 1, or at least partially overlap with both the orthographic projection of the wide wire portion 3111 and the orthographic projection of the wide wire portion 3112 on the base substrate 1), a total number of the second part of drive signal wires 2001 is less than a total number of the first part of drive signal wires, so as to reduce the parasitic capacitance on the drive signal wires as much as possible and achieve a better display effect. Other features and corresponding technical effects of the embodiment illustrated in FIG. 2C are the same as those of the embodiment illustrated in FIG. 2B, and the repetitions are not described again.

Figure 3B:
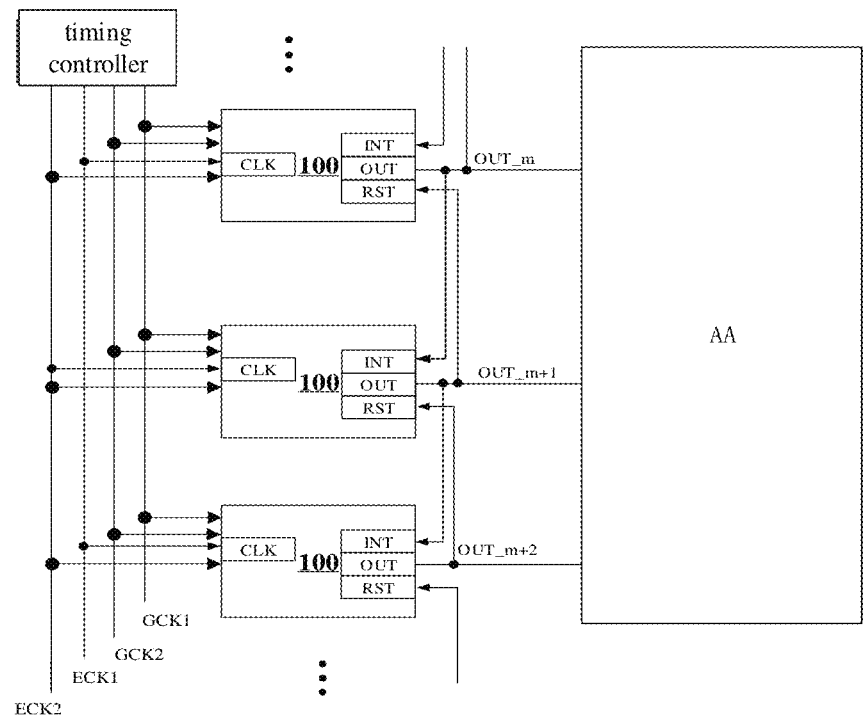
FIG. 3B is a schematic diagram of clock signal wires and a plurality of shift registers.

FIG. 3A is a partially enlarged schematic diagram of the drive signal wires in FIG. 1A, and FIG. 3B is a schematic diagram of a clock signal wire and a plurality of shift registers. As illustrated in FIG. 3A, the drive signal wires 20 in FIG. 2A includes a plurality of signal wires spaced apart from each other. With reference to FIGS. 3A and 3B, the drive circuit includes a gate drive circuit, such as, a GOA drive circuit; the gate drive circuit includes a plurality of cascaded shift registers and a trigger signal wire. The plurality of cascaded shift registers include a first shift register, a second shift register, . . . , and an N-th shift register, and N is a positive integer; each shift register includes a signal input terminal INT and a signal output terminal OUT. The display substrate includes a plurality of display pixels arranged in an array, the plurality of display pixels arranged in the array includes a plurality of rows of display pixels, which are in one-to-one correspondence to the plurality of cascaded shift registers. A trigger signal wire is connected to the signal input terminal of the first shift register and configured to provide a trigger drive signal to the first shift register, and the first shift register output a corresponding drive signal from its signal output terminal OUT in response to the trigger signal to scan a row of display pixel of the display region (AA) corresponding to the first shift register, and the drive signal wires include this trigger signal wire. As illustrated in FIG. 3B, a drive signal, as a trigger signal of a next stage shift register, output from the signal output terminal OUT of a previous stage of shift register is input to the signal input terminal INT of the next stage of shift register.

For example, in some embodiments, as illustrated in FIG. 3A, the drive signal includes a scan drive signal; the trigger signal wire includes a scan trigger signal wire GSTV. The scan trigger signal wire GSTV is configured to provide a scan trigger signal to the first shift register so that the first shift register outputs a scan drive signal, for example, the scan drive signal is output from the signal output terminal OUT of the first shift register, and is provided to the pixel circuit.

Figure 4A:
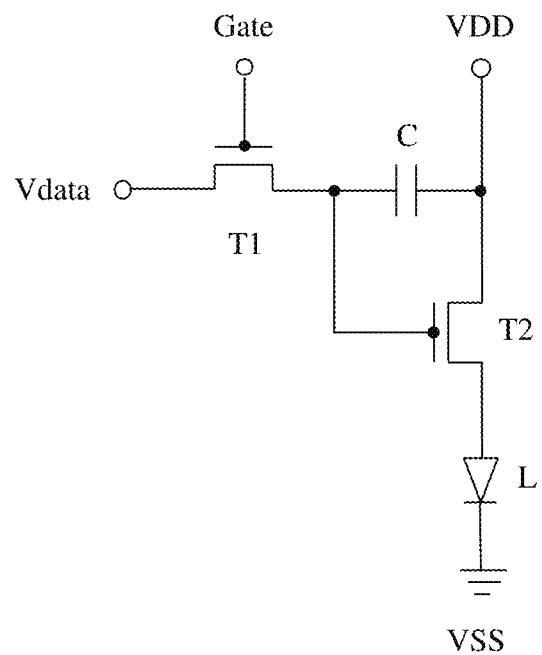
FIG. 4A is an equivalent circuit diagram of a pixel circuit of a display substrate provided by an embodiment of the present disclosure.

FIG. 4A is an equivalent circuit diagram of a pixel circuit of a display substrate provided by an embodiment of the present disclosure. With reference to FIG. 4A and FIGS. 3A-3B, for example, the gate drive circuit further includes gate scan wires, for example, includes gate scan wires respectively correspond to each row of display pixels. For a gate scan wire corresponding to each row of display pixels, the gate scan wire is connected to the signal output terminal OUT of the plurality of shift registers and configured to provide a scan drive signal output from the plurality of shift registers to the pixel circuits. For example, the pixel circuit illustrated in FIG. 4A is a pixel circuit with 2T1C. The pixel circuit includes a data wire, a light emission device, and a first transistor T1, a second transistor T2 and a storage capacitor C in each display pixel. The data wire is configured to provide a data signal to the display pixel, for example, the data signal is a data voltage signal. The light emission device L includes a first electrode and a second electrode, and the first power supply wire 31 (VSS) is connected to the first electrode of the light emission device L to receive the first power supply voltage; A gate electrode of the first transistor T1 is connected to a gate scan wire to receive the scan drive signal, a first electrode of the first transistor T1 is connected to the data wire to receive the data signal, a second electrode of the second transistor T2 is connected to the second power supply wire 32 (VDD) to receive the second power supply voltage, and a second electrode of the second transistor T2 is connected to the second electrode of the light emission device L to receive the second power supply voltage. A first electrode of the storage capacitor C is connected to a gate electrode of the second transistor T2, and a second electrode of the storage capacitor C is connected to the second power supply wire 32 (VDD). For example, the first transistor T1 and the second transistor T2 are both N-type transistors. For example, in the case where an N-type transistor is used, IGZO can be used as an active layer of the thin film transistor to reduce the size of the drive transistor and prevent leakage current. For example, the N-type transistor is turned on in response to a high level signal.

According to the drive current formula $I=K*(Vsg-|Vth|)^2=K*(Vdd-Vdata-|Vth|)^2$, the data voltage Vdata directly affects the drive current, and a display brightness is directly proportional to the drive current, so the display brightness is affected by Vdata. FIG. 4C illustrates the relationship between the data signal Vdata and a data signal reading time T in an ideal state, and FIG. 4D illustrates the relationship between the data signal Vdata and the data signal reading time T in an actual state. The embodiment of the present disclosure reduces the parasitic capacitance on the drive signal wires, such as the scan trigger signal wire GSTV and a light emission control trigger signal wire ESTV, so that a response time of the data signal Vdata can be reduced, i.e., a rising time Tr and a falling time Tf can be reduced, so that the actual data signal Vdata is closer to the ideal state, thereby obtaining a better display effect.

For example, for the embodiment illustrated in FIG. 4A, the second power supply circuit 6 provides the scan trigger signal for the scan trigger signal wire, and the scan trigger signal is input into the first shift register through the scan trigger signal wire, so that the scan drive signal is output through the first shift register, and the scan drive signal is provided to the pixel circuit through the gate scan wire.

In other embodiments of the present disclosure, it is not limited to the case that the type of pixel circuit is the pixel circuit with 2T1C, for example, the type of pixel circuit can also be any implementable type, such as 4T2C and 7T1C.

For example, in some embodiments, the drive signal further includes a light emission control drive signal; the trigger signal wire further includes a light emission control trigger signal wire ESTV configured to provide a light emission control trigger signal to the first shift register so that the first shift register outputs the light emission control drive signal, and the light emission control drive signal is provided to the pixel circuit. This embodiment is described below by taking the case that the display substrate adopts a pixel circuit with 7T1C as an example.

Figure 4B:
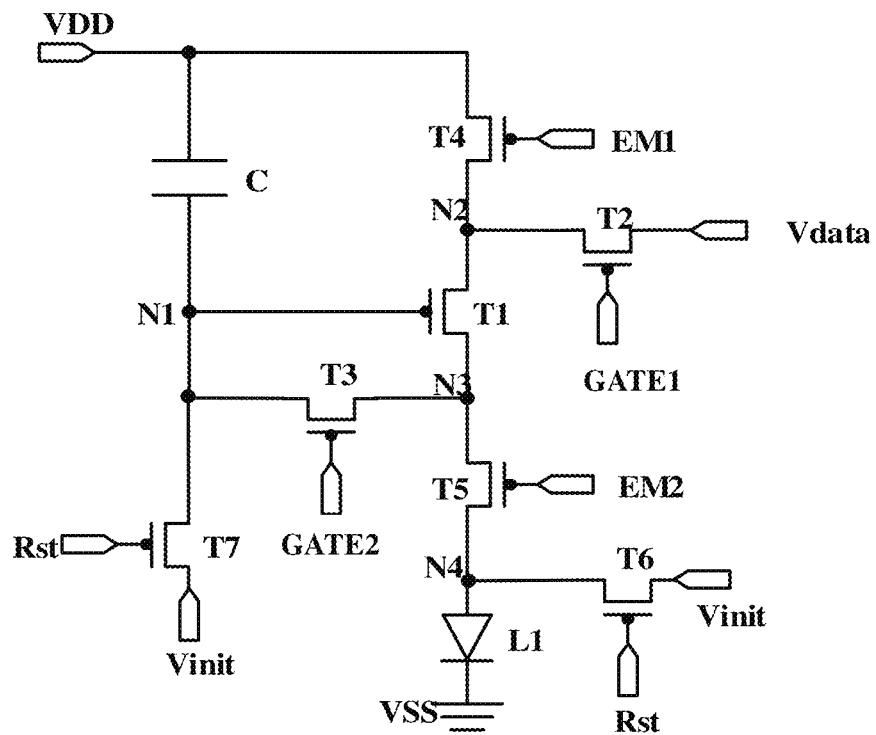
FIG. 4B is an equivalent circuit diagram of another pixel circuit of a display substrate provided by an embodiment of the present disclosure.
Figure 4C:
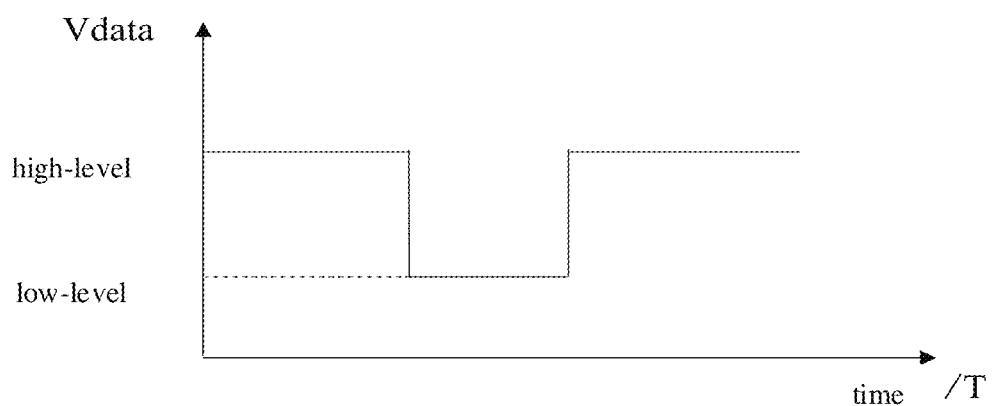
FIG. 4C illustrates a relationship between a data signal Vdata and a data signal reading time T in an ideal state.
Figure 4D:
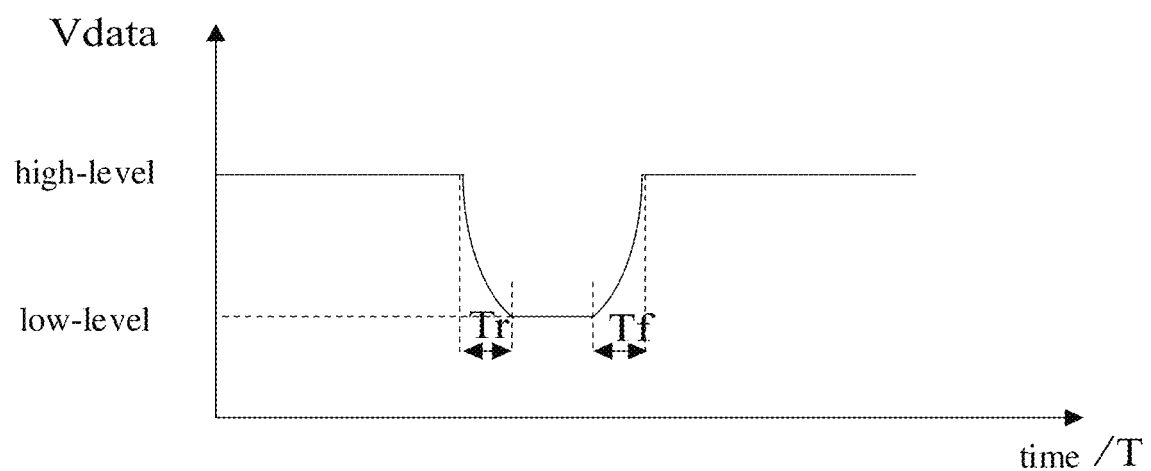
FIG. 4D illustrates a relationship between the data signal Vdata and the data signal reading time T in an actual state.

Illustratively, FIG. 4B is an equivalent circuit diagram of another pixel circuit of a display substrate provided by an embodiment of the present disclosure, and the pixel circuit illustrated in FIG. 4B is a pixel circuit with 7T1C. Referring to FIG. 4B and FIGS. 3A-3B, the scan drive signal includes a first scan drive signal and a second scan drive signal, and the light emission control drive signal include a first light emission control drive signal, a second light emission control drive signal, and a reset drive signal. The gate drive circuit further includes a first scan wire GATE1, a second scan wire GATE2, a first light emission control wire EM1, and a second light emission control wire EM2. These four signal wires are correspondingly arranged for each row of display pixels, and for each row of display pixels, the first scan wire GATE1 and the second scan wire GATE2 are connected to the signal output terminal OUT of the shift register and configured to respectively provide the first scan drive signal and the second scan drive signal output from the shift register to the pixel circuit; the first light emission control wire EM1 and the second light emission control wire EM2 are connected to the signal output terminal OUT of the shift register and configured to respectively provide the first light emission control drive signal and second light emission control drive signal output from the shift register to the pixel circuit. For example, the pixel circuit includes a data wire, a light emission device L1, an initial signal wire Vinit, and a first transistor T1, a second transistor T2, a third transistor T3, a fourth transistor T4, a fifth transistor T5, a sixth transistor T6, a seventh transistor T7, and a storage capacitor C located in each display pixel. The data wire is configured to provide a data signal Vdata to the display pixel, for example, the data signal Vdata is a data voltage; the light emission device L1 includes a first electrode and a second electrode, and the first power supply wire 31 (VSS) is connected to the first electrode of the light emission device L1 to receive the first power supply voltage; the initial signal wire Vinit is configured to provide an initial signal to the display pixel. A gate electrode of the first transistor T1 is connected to a first node N1; a first electrode of the first transistor T1 is connected to a second node N2, and a second electrode of the first transistor T1 is connected to a third node N3, a gate electrode of the second transistor T2 is connected to the first scan wire GATE1 to receive the first scan drive signal, a first electrode of the second transistor T2 is connected to the data wire to receive the data signal Vdata, and a second electrode of the second transistor T2 is connected to the second node N2, a gate electrode of the third transistor T3 is connected to the second scan wire GATE2 to receive the second scan drive signal, a first electrode of the third transistor T3 is connected to the first node N1 (i.e., the gate electrode of the first transistor T1), and a second electrode of the third transistor T3 is connected to the third node N3, a first electrode of the storage capacitor C is connected to the first node N1 (i.e., the gate electrode of the first transistor T1), and a second electrode of the storage capacitor C is connected to the second power supply wire 32 (VDD) to receive the second power supply voltage, a gate electrode of the fourth transistor T4 is connected to the first light emission control wire EM1 to receive the first light emission control drive signal, a first electrode of the fourth transistor T4 is connected to the second power supply wire 32 (VDD) to receive the second power supply voltage, and a second electrode of the fourth transistor T4 is connected to the second node N2, a gate electrode of the fifth transistor T5 is connected to the second light emission control wire EM2 to receive the second light emission control drive signal, a first electrode of the fifth transistor T5 is connected to the third node N3, and a second electrode of the fifth transistor T5 is connected to the second electrode of the light emission device L1, a gate electrode of the sixth transistor T6 is connected to a reset control terminal to receive the reset drive signal, a first electrode of the sixth transistor T6 is connected to the initial signal wire Vinit to receive the initial signal, and a second electrode of the sixth transistor T6 is connected to the second electrode of the light emission device L1, a gate electrode of the seventh transistor T7 is connected to the reset control terminal to receive the reset drive signal, a first electrode of the seventh transistor T7 is connected to the initial signal wire Vinit to receive the initial signal, and a second electrode of the seventh transistor T7 is connected to the first node N1.

For example, in the embodiment illustrated in FIG. 4B, the first to seventh transistors T1 to T7 are all N-type transistors. For example, in the case that an N-type transistor is used, IGZO can be used as the active layer of the thin film transistor to reduce the size of the drive transistor and prevent the leakage current. The N-type transistor is turned on in response to a high-level signal. For example, in other embodiments, the pixel circuit may adopt a pixel circuit with N-type and P-type transistors. For example, the third transistor T3, the sixth transistor T6 and the seventh transistor T7 adopt N-type transistors, and the rest transistors adopt P-type transistors. Because the leakage current of the N-type transistors is small, it is possible to overcome the phenomenon of flashing in the case where the pixel circuit is used for low-frequency driving. In addition, because the third transistor T3 of the compensation circuit in the pixel circuit adopts the N-type transistor with a small leakage current and a small size, the storage capacitor C of the compensation circuit can adopt the capacitor with small size, which can increase the resolution of the display panel. Meanwhile, because the leakage current of the N-type transistor is small, it is unnecessary to consider the aging problem of the N-type transistor. For example, with reference to FIGS. 1A, 3A and 4B, the drive signal wire further includes an initial signal wire Vinit, the initial signal wire Vinit extends from the non-display region 12 to the display region 11, for example, the initial signal wire Vinit extends through the region where the shift register is located to the display region 11, and is connected to the first electrode of the sixth transistor T6 and the first electrode of the seventh transistor T7 to provide them with initial signals, that is, the first node N1 and the fourth node N4 in a previous phase is reset before a next display phase.

For example, as illustrated in FIGS. 3A-3B, the drive signal wires further include clock signal wires, and the clock signal wires are configured to provide a clock control drive signal to each shift register so that the scan drive signal and the light emission control drive signal is provided to the pixel circuit. The clock signal wires include, for example, a first scan clock signal wire GCLK1, a second scan clock signal wire GCLK2, a first light emission control clock signal wire ECLK1 and a second light emission control clock signal wire ECLK2, these four lock signal wires respectively provide the first scan clock signal wire, the second scan clock signal, the first light emission control clock signal and the second light emission control clock signal to the shift registers. The shift registers respectively output the first scan drive signal, the second scan drive signal, the first light emission control drive signal and the second light emission control drive signal, this light emission control drive signal is provided to the pixel circuit respectively through the first scan wire, the second scan wire, the first light emission control wire and the second light emission control wire. That is, the clock signal wire is configured to provide the first scan drive signal, the second scan drive signal, the first light emission control drive signal and the second light emission control drive signal to the pixel circuit through the shift register, respectively.

For example, as illustrated in FIGS. 3A-3B, the drive signal wires further include a low-level signal wire VGL and a high-level signal wire VGH. The low-level signal wire VGL is connected to each shift register and configured to provide a first voltage drive signal to each shift register; and the high-level signal wire VGH is connected to each shift register and configured to provide a second voltage drive signal to each shift register, the second voltage is greater than the first voltage, so as to provide a power supply voltage for the operation of each shift register.

With respect to the embodiment illustrated in FIG. 4B, the second power supply circuit 6 provides the scan trigger signal to the scan trigger signal wire, provides the light emission control trigger signal to the light emission control trigger signal wire, and provides the clock control drive signals respectively to the first scan clock signal wire GCLK1, the second scan clock signal wire GCLK2, the first light emission control clock signal wire ECLK1 and the second light emission control clock signal wire ECLK2. Furthermore, the second power supply circuit 6 provides the first voltage drive signal to the low-level signal wire VGL and the second voltage drive signal to the high-level signal wire VGH, and the first voltage drive signal and the second voltage drive signal are respectively provided to the shift register through the low-level signal wire VGL and the high-level signal wire VGH.

It should be noted that the types of drive signal wires are not limited to those case described above, and can also include signal wires with other functions. The types of drive signal wires described in the above embodiments are only exemplary.

Referring to FIG. 1A and FIG. 2A, for example, the first power supply wire 31 includes a first power supply sub-trace 3101 and a second power supply sub-trace 3102, and the first power supply sub-trace 3101 and the second power supply sub-trace 3102 include a narrow wire portion 312 and a wide wire portion 3111/3112, the second power supply wire 32 includes a first power supply sub-trace 3201 and a second power supply sub-trace 3202, the first power supply sub-trace 3201 and the second power supply sub-trace 3202 respectively include a narrow wire portion 322 and a wide wire portion 3211/3212. The drive signal wires 20 include a first signal sub-trace 201 and a second signal sub-trace 202 which respectively extend to opposite sides of the display region 11, a narrow wire portion of the first power supply sub-trace 3101 of the first power supply wire 31 and a narrow wire portion of the first power supply sub-trace 3201 of the second power supply wire 32 at least partially overlap with the first signal sub-trace 201 in the direction perpendicular to the base substrate 1; a narrow wire portion of the second power supply sub-trace 3102 of the first power supply wire 31 and a narrow wire portion of the second power supply sub-trace 3202 of the second power supply wire 32 at least partially overlap with the second signal sub-trace 202 in the direction perpendicular to the base substrate 1. That is, the drive circuits are provided on both sides of the display region 11, and on the both sides, in a region where the drive signal wires of the drive circuits overlap with the power supply wire, the power supply wire is narrowed. For example, the drive circuits on the both sides are symmetrical. The drive signal wires on the both sides include one or more selected from a group consisting of the above trigger signal wire, initial signal wire, clock signal wire, low-level signal wire and high-level signal wire, respectively. That is, the second signal sub-trace 202 also includes a plurality of signal wires. Of course, in other embodiments, the drive circuit may be provided on only one side of the display region 11.

For example, as illustrated in FIG. 1A, the first power supply wire 31 and the second power supply wire 32 enter the display region 11 from the first side of the display region 11 close to the first power supply circuit 5; or, in other embodiments, the first power supply wire 31 and the second power supply wire 32 enter the display region from a side, intersecting with the first side of the display region, of the display region.

Figure 5:
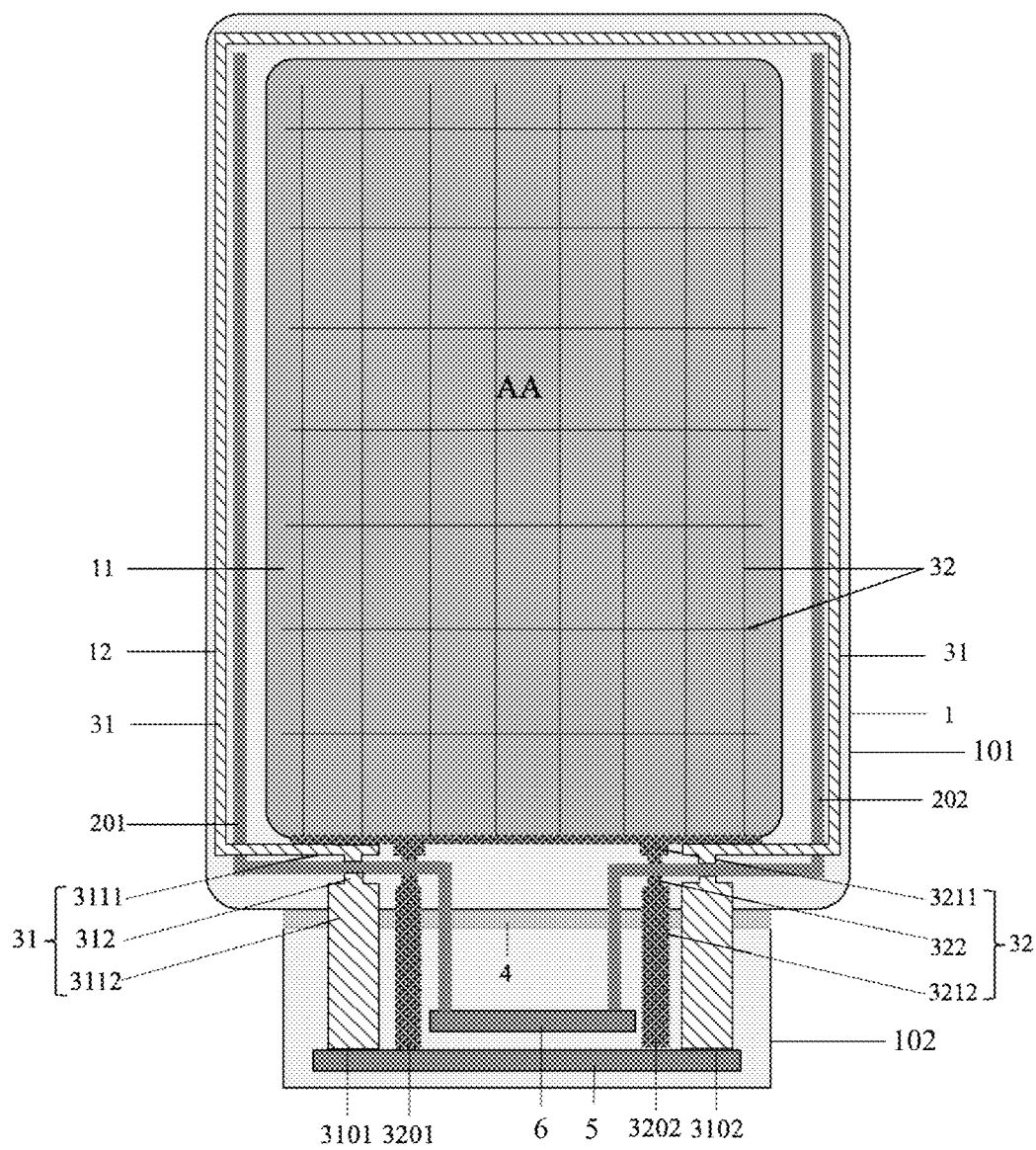
FIG. 5 is a structural schematic diagram of another display substrate provided by an embodiment of the present disclosure.

For example, in other embodiments, as illustrated in FIG. 5, the narrow wire portion 312 of the first power supply wire 31 and the narrow wire portion 322 of the second power supply wire 32 are located in the non-display region 12 on the first side of the display substrate.

Other features and technical effects of the display substrate illustrated in FIG. 5 are the same as those in the embodiments illustrated in FIGS. 1A and 2A, reference is made to the previous description, and repetitions are not repeated.

For example, the display substrate provided by the embodiment of the present disclosure is an organic light emission diode (OLED) display substrate.

Figure 6:
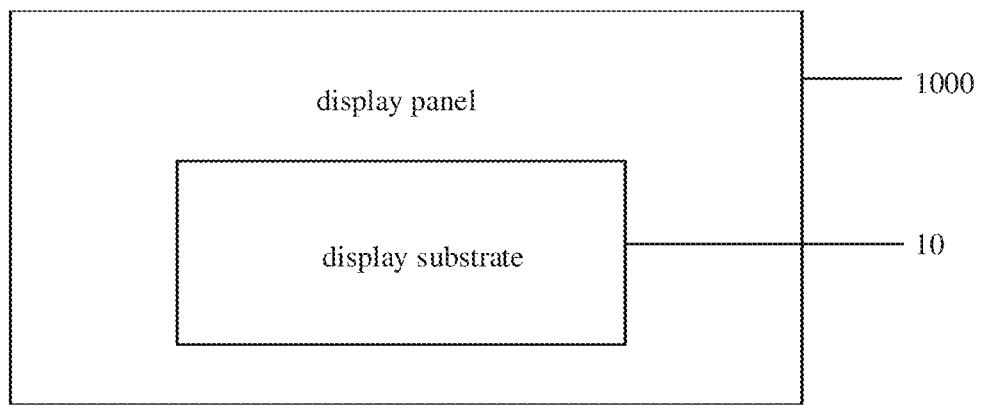
FIG. 6 is a schematic diagram of a display panel provided by an embodiment of the present disclosure.

For example, at least one embodiment of the present disclosure further provides a display panel, the display panel includes the display substrate provided by any one of the embodiments of the present disclosure. FIG. 6 is a schematic diagram of a display panel provided by an embodiment of the present disclosure. As illustrated in FIG. 6, the display panel 1000 provided by at least one embodiment of the present disclosure includes the display substrate 10 provided by any one of the embodiments of the present disclosure. Other structures of the display panel 1000 can be designed according to specific needs using conventional techniques in the field, which is not limited by the present disclosure.

For example, at least one embodiment of the present disclosure further provides a display device, and the display device includes the display panel provided by any one of the embodiments of the present disclosure.

For example, the display device is an organic light emission diode (OLED) display device. For example, the display device may be mobile phones, tablet computers, monitors, notebook computers, ATMs and other products. Other structures of the display device can be designed according to specific needs using conventional techniques in the field.

The above is only exemplary embodiments of the present invention, and is not intended to limit the scope of the present disclosure. The scope of the present disclosure is defined by the appended claims.

What is claimed is:

1. A display substrate, comprising:
   a base substrate comprising a display region and a non-display region, wherein the display region comprises a display pixel, and the non-display region surrounds at least a part of the display region;
   a pixel circuit comprising a power supply wire, wherein the power supply wire is configured to provide a power supply voltage to the display pixel; and
   a drive circuit at least partially in the non-display region, and comprising a drive signal wire, wherein the drive signal wire is configured to provide a drive signal to the pixel circuit;
   the power supply wire comprises a narrow wire portion and a wide wire portion connected to the narrow wire portion, an orthographic projection of the narrow wire portion on the base substrate at least partially overlaps with an orthographic projection of the drive signal wire on the base substrate, and a wire width of the narrow wire portion is less than a wire width of the wide wire portion;
   the display substrate has a first side for display and a second side opposite to the first side, and comprises a bending region at an edge of the base substrate, and the power supply wire and the drive signal wire extend from the first side to the bending region and cross the bending region to further extend to the second side; and
   the narrow wire portion of the power supply wire is at least on the second side of the display substrate;
   a part of the power supply wire at a side of the bending region away from the display region is in a shape of a strip extending along a longitudinal direction, and both the narrow wire portion and the wide wire portion extend along the longitudinal direction; the bending region is in a shape of a strip extending along a transverse direction, and the longitudinal direction intersects the transverse direction.

2. The display substrate according to claim 1, wherein the drive circuit comprises a plurality of the drive signal wires, an orthographic projection of a first part of drive signal wires among the plurality of drive signal wires on the base substrate at least partially overlaps with the orthographic projection of the narrow wire portion on the base substrate, and an orthographic projection of a second part of drive signal wires among the plurality of drive signal wires on the base substrate at least partially overlaps with the orthographic projection of the wide wire portion on the base substrate, and a total number of the second part of drive signal wires is less than a total number of the first part of drive signal wires; or,
   an orthographic projections of the plurality of drive signal wires on the base substrate do not overlap with the orthographic projection of the wide wire portion on the base substrate.

3. The display substrate according to claim 1, wherein the drive signal wire comprises a bending portion on the second side of the display substrate, and the bending portion comprises a transverse portion and a longitudinal portion that are connected with each other; and
   an extension direction of the longitudinal portion is substantially identical to an extension direction of the power supply wire, and the transverse portion overlaps with the power supply wire in a direction perpendicular to the base substrate.

4. The display substrate according to claim 1, further comprising:
   a first power supply circuit on the second side of the display substrate and configured to provide the power supply voltage to the power supply wire; and
   a second power supply circuit on the second side of the display substrate and configured to provide the drive signal to the drive circuit.

5. The display substrate according to claim 4, wherein the power supply wire is connected to the first power supply circuit and led out from the first power supply circuit, and the drive signal wire is connected to the second power supply circuit and led out from the second power supply circuit;
   a position, where the power supply wire is led out from the first power supply circuit, is on a side of a position, where the drive signal wire is led out from the second power supply circuit, close to the edge of the display substrate.

6. The display substrate according to claim 1, wherein the wide wire portion comprises a first portion and a second portion, and both the first portion and the second portion extend along the longitudinal direction; and
   the narrow wire portion has a first end and a second end in the longitudinal direction, the first portion is connected to the first end of the narrow wire portion, and the second portion is connected to the second end of the narrow wire portion.

7. The display substrate according to claim 1, wherein the wire width of the narrow wire portion is less than or equal to half of the wire width of the wide wire portion.

8. The display substrate according to claim 1, wherein a wire width of the power supply wire is greater than a wire width of the drive signal wire.

9. The display substrate according to claim 8, wherein the wire width of the narrow wire portion of the power supply wire is greater than the wire width of the drive signal wire.

10. The display substrate according to claim 1, wherein the power supply wire comprises:
- a first power supply wire configured to provide a first power supply voltage to the display pixel; and
- a second power supply wire configured to provide a second power supply voltage to the display pixel, wherein a polarity of the second power supply voltage is opposite to a polarity of the first power supply voltage; and
- at least one selected from a group consisting of the first power supply wire and the second power supply wire comprises the narrow wire portion and the wide wire portion.

11. The display substrate according to claim 10, wherein the drive circuit comprises a gate drive circuit; and
the gate drive circuit comprises:
- a plurality of cascaded shift registers comprising N shift registers wherein N is a positive integer, and each of the shift registers comprises a signal input terminal and a signal output terminal; and
- a trigger signal wire connected to the signal input terminal of first shift register and configured to provide a trigger signal to the first shift register, wherein the drive signal wire comprises the trigger signal wire.

12. The display substrate according to claim 11, wherein the drive signal comprises a scan drive signal; and
the trigger signal wire comprises:
- a scan trigger signal wire configured to provide a scan trigger signal to the first shift register so that the first shift register outputs the scan drive signal, wherein the scan drive signal is provided to the pixel circuit.

13. The display substrate according to claim 12, wherein the drive signal further comprise a light emission control drive signal; and
the trigger signal wire further comprises:
- a light emission control trigger signal wire configured to provide a light emission control trigger signal to the first shift register so that the first shift register outputs the light emission control drive signal, wherein the light emission control drive signal is provided to the pixel circuit.

14. The display substrate according to claim 13, wherein the drive signal wire further comprises a clock signal wire configured to provide a clock control drive signal to each of the shift registers so that the scan drive signal and the light emission control drive signal are provided to the pixel circuit.

15. The display substrate according to claim 11, wherein the drive signal wire further comprises:
- a low-level signal wire which is connected to each of the shift registers and configured to provide a first voltage drive signal to each of the shift registers; and
- a high-level signal wire which is connected to each of the shift register and configured to provide a second voltage drive signal to each shift register, wherein the second voltage is greater than the first voltage.

16. The display substrate according to claim 10, wherein each selected from the group consisting of the first power supply wire and the second power supply wire respectively comprises a first power supply sub-trace and a second power supply sub-trace, and the first power supply sub-trace and the second power supply sub-trace respectively comprise the narrow wire portion and the wide wire portion;
the drive signal wire comprise a first signal sub-trace and a second signal sub-trace, and an extension direction of the first signal sub-trace is opposite to an extension direction of the second signal sub-trace extend, and the first signal sub-trace and the second signal sub-trace are respectively at two opposite sides of the display region;
the narrow wire portion of the first power supply sub-trace at least partially overlaps with the first signal sub-trace in a direction perpendicular to the base substrate, and the narrow wire portion of the second power supply sub-trace at least partially overlaps with the second signal sub-trace in the direction perpendicular to the base substrate.

17. The display substrate according to claim 1, wherein the narrow wire portion is in the non-display region on the first side of the display substrate.

18. The display substrate according to claim 1, wherein the power supply wire enters the display region from a first side of the display region close to the first power supply circuit; or,
the power supply wire enters the display region from a side, which intersects with the first side of the display region, of the display region.

19. A display panel, comprising the display substrate according to claim 1.

20. A display device, comprising the display panel according to claim 19.

* * * * *